United States Patent [19]
Sato

[11] 4,074,148
[45] Feb. 14, 1978

[54] ADDRESS BUFFER CIRCUIT IN SEMICONDUCTOR MEMORY

[75] Inventor: Takashi Sato, Kodaira, Japan

[73] Assignee: Hitachi, Ltd., Japan

[21] Appl. No.: 692,367

[22] Filed: June 3, 1976

[30] Foreign Application Priority Data

June 4, 1975 Japan .................................. 50-66565

[51] Int. Cl.² ..................... H03K 3/286; H03K 3/353
[52] U.S. Cl. .................................. 307/279; 307/269; 307/270; 307/DIG. 1; 365/205
[58] Field of Search ............... 307/238, 269, 279, 291, 307/DIG. 1, DIG. 3, DIG. 5, 289, 264; 340/173 R

[56] References Cited
U.S. PATENT DOCUMENTS

| | | | |
|---|---|---|---|
| 3,848,237 | 11/1974 | Geilhufe et al. | 307/279 X |
| 3,868,657 | 2/1975 | Hoffman et al. | 307/238 X |
| 3,902,082 | 8/1975 | Proebsting et al. | 307/238 X |
| 3,906,464 | 9/1975 | Lattin | 307/DIG. 5 X |
| 3,938,109 | 2/1976 | Gionis et al. | 307/DIG. 3 X |
| 3,959,781 | 5/1976 | Mehta et al. | 307/DIG. 5 X |
| 3,969,706 | 7/1976 | Proebsting et al. | 340/173 R |

*Primary Examiner*—Larry N. Anagnos
*Attorney, Agent, or Firm*—Craig & Antonelli

[57] ABSTRACT

In an address buffer circuit in a semiconductor memory including a flip-flop formed of MISFETs and an output circuit consisting of two drivers each formed of MISFETs, and producing a binary address signal, the flip-flop is supplied with a constant operating voltage and triggered by a pulse signal of shorter pulse width than that of a chip enable signal and the MISFETs of the driver on the ground side have the gates cross-coupled to the outputs of the respective drivers so that at least one grounding MISFET in each driver is turned on in the outputting period to prevent the floating of the output level.

7 Claims, 5 Drawing Figures

ADDRESS BUFFER CIRCUIT IN SEMICONDUCTOR MEMORY

BACKGROUND OF THE INVENTION

1. FIELD OF THE INVENTION

This invention relates to an address buffer circuit, and more particularly to an address buffer circuit in a semiconductor memory.

2. DESCRIPTION OF THE PRIOR ART

Such address buffer circuits for use in a semiconductor memory circuit are known as one disclosed in Japanese Laid-Open Patent Application No. 96640/1974 corresponding to U.S. Pat. No. 3,795,898 which aims at rapid operation with the use of a dynamic flip-flop circuit as shown in FIG. 5. In this circuit, an insulated gate type field effect transistor (hereinbelow, referred to as metal-insulator-semiconductor field-effect-transistor or MISFET $Q_1$ serves as a transfer gate for transferring a transistor-transistor logic (TTL) level into a MISFET logic level and transmitting an address input signal A$i$ to the gate of a switching MISFET $Q_5$ of a dynamic type flip-flop and to the gate of a MISFET $Q_8$ of the output circuit. Load MISFETs $Q_2$ and $Q_3$ of the flip-flop serve to supply current when both a chip enable signal CE as a control signal of the memory and the clock pulse $\phi$ take on a "1" level (i.e. a high level; description will be made in the case of N channel MISFETs hereinbelow). The outputs A and $\overline{A}$ of the flip-flop are determined according to the input signal A$i$. The MISFETs $Q_6$ and $Q_8$ constituting an output circuit are turned on by the respective outputs $\overline{A}$ and A and select a predetermined decoder. Further, MISFETs $Q_7$ and $Q_9$ constituting the output driver circuit with the MISFETs $Q_6$ and $Q_8$ are turned on for the period of chip-nonselection ($\overline{CE}$ = "1") and hold both the outputs a$i$ and $\overline{ai}$ at "0".

In the address buffer circuit of the above structure, the chip enable signal CE serves as the current source for the flip-flop circuit and supplies dc current through one inverter circuit ($Q_2$, $Q_4$) or ($Q_3$, $Q_5$) of the flip-flop circuit. Therefore, the pulse generator circuit for generating the chip enable signal CE should have a large current capacity, e.g., a driver circuit of large current capacity formed of bipolar transistors is needed. This brings about problems in the system packaging.

Further, when the chip enable signal CE is "0" (ground level), the input signal A$i$ is "1" (high level) and the clock pulse $\phi$ is "1", input current is allowed to flow through the MISFETs $Q_1$ and $Q_2$. In this case since the number of address buffer circuits is usually over ten in a semiconductor memory circuit, the current consumption becomes large. A total memory system comprises a plurality of such semiconductor memory circuits, and hence the total current consumption becomes even larger.

Further, when a word selection line is activated, one pair of MISFETs ($Q_6$, $Q_7$) or ($Q_8$, $Q_9$) of the output circuit are turned off. Thus, the output level of the driver formed of the turned-off MISFETs floats. Then, the decoder connected to such a driver also floats. Therefore, the level of such a decoder may be easily affected by external noises or stray capacitances in the circuit formed in a semiconductor chip to cause malfunctions.

SUMMARY OF THE INVENTION

This invention aims to solve the above problems, and an object of this invention is to provide an address buffer circuit capable of reducing the current through the input circuit and of preventing the floating of the output level.

According to a basic embodiment of this invention, there is provided an address buffer circuit in a semiconductor memory formed in a semiconductor chip and requiring two opposite output signals a$i$ and $\overline{ai}$ for an input signal A$i$, comprising a dynamic type flip-flop for receiving the input signal A$i$ and supplying outputs A and $\overline{A}$ and an output circuit for receiving the output signals A and $\overline{A}$ of the flip-flop and supplying output signals a$i$ and $\overline{ai}$, wherein power source terminals of the dynamic type flip-flop are supplied with a constant operating voltage, the gate of a load MISFET of the flip-flop is applied with a signal for turning on the load MISFET for a predetermined short period in synchronism with a chip enable signal, the outputs A and $\overline{A}$ of the flip-flop are applied to the gates of respective MISFETs of the driver circuits constituting the output circuit, the gate of the other MISFET of each driver circuit is applied with a signal of inverted phase to the signal applied to the gate of the above-mentioned one MISFET, and MISFETs are connected in parallel to the MISFETs on the ground potential side of the flip-flop and the output circuit and driven to be conductive in the period of chip-nonselection.

The above and other objects, features and advantages of this invention will become apparent from the following description of the embodiment of this invention when taken in conjunction with the accompanying drawings.

DESCRIPTION OF THE PREFERRED EMBODIMENTS

Figure 1:
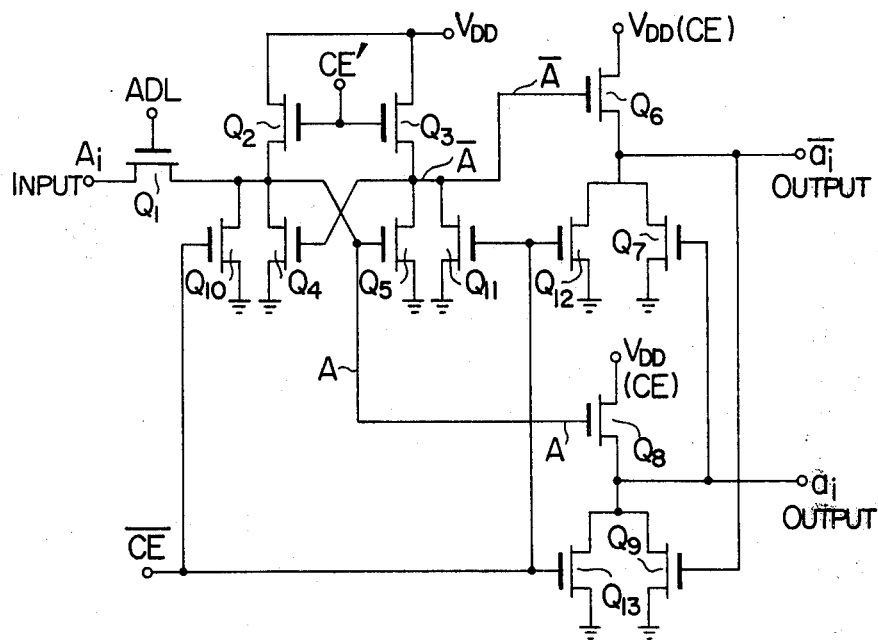
FIG. 1 is a circuit diagram of an embodiment of the address buffer circuit according to this invention.
Figure 5:
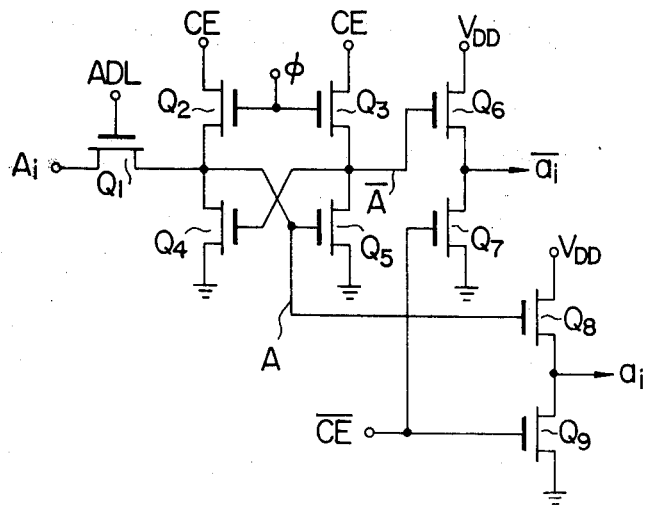
FIG. 5 is a circuit diagram of a conventional address buffer circuit.

FIG. 1 shows an address buffer circuit which has a structure basically analogous to that of the conventional circuit of FIG. 5. Throughout the figures, similar reference numerals indicate similar parts. A dynamic type flip-flop circuit comprises MISFETs $Q_2$ to $Q_5$. The MISFETs $Q_2$ and $Q_3$ serve as the load of the flip-flop. A signal CE' in synchronism with a chip enable (i.e., also called cenable) signal CE as described later is applied to the gates of the load MISFETs $Q_2$ and $Q_3$ for reducing the dc current consumption in this flip-flop circuit. A power source, not shown, supplies constant operating voltage $V_{DD}$.

The address input signal A$i$ is applied through a transfer gate MISFET $Q_1$ to the gate of one input MISFET $Q_5$ of this flip-flop. The outputs A and $\overline{A}$ of the flip-flop are applied to an output circuit described below capable of preventing the floating of its output levels. The output circuit includes one driver circuit formed of MISFETs $Q_6$ and $Q_7$ and the other driver circuit formed of MISFETs $Q_8$ and $Q_9$. The outputs $\overline{A}$ and A of the flip-flop are applied to the gates of the MISFETs $Q_6$ and $Q_8$, respectively. The gates of the MISFETs $Q_7$ and $Q_9$ are applied with the outputs $ai$ and $\overline{ai}$ of the driver circuits, respectively. Further, MISFETs $Q_{10}$ to $Q_{13}$ are connected in parallel with the MISFETs $Q_4$, $Q_5$, $Q_7$ and $Q_9$, respectively. The gates of these MISFETs $Q_{10}$ to $Q_{13}$ are applied with a signal $\overline{CE}$ which takes on a "1" (high) level during the period of chip-nonselection so as to determine the states of the flip-flop and the output signals $ai$ and $\overline{ai}$. Thus, when the signal $\overline{CE}$ is at a "1" level, the outputs A and $\overline{A}$ of the flip-flop and the outputs $ai$ and $\overline{ai}$ of the output circuit are assured to be at a "0" level.

Here, a power source for the output circuit may be the constant operating voltage source $V_{DD}$ or the chip enable signal CE providing another operating voltage (taking on a "1" level during the period of chip selection).

Figure 2:
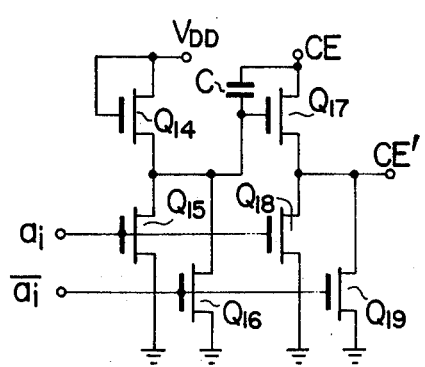
FIG. 2 is a circuit diagram of a pulse generator circuit.

The flip-flop circuit in a seimconductor memory is required to supply its outputs only for 30 to 40 nanoseconds upon the chip selection. Therefore, the signals CE' for driving the load MISFETs $Q_2$ and $Q_3$ may be generated by a circuit as shown in FIG. 2. In the circuit of FIG. 2, the following logic formula (1) is satisfied.

$$CE' = \overline{CE\,(ai + \overline{ai})} \qquad (1)$$

Namely, parallel switching MISFETs $Q_{15}$ and $Q_{16}$ are connected to a load MISFET $Q_{14}$ in the former stage and the output signals $ai$ and $\overline{ai}$ of the output circuit are applied to the gates of the MISFETs $Q_{15}$ and $Q_{16}$. The output of this circuit (former stage) drives the load MISFET $Q_{17}$ of the latter stage. To this load MISFET $Q_{17}$ are connected parallel MISFETs $Q_{18}$ and $Q_{19}$ which are applied with the output signals $ai$ and $\overline{ai}$ of the output circuit, respectively. The construction of the latter stage is similar to the former stage. The chip enable signal CE is supplied to this latter stage circuit as the operating voltage.

Figure 3:
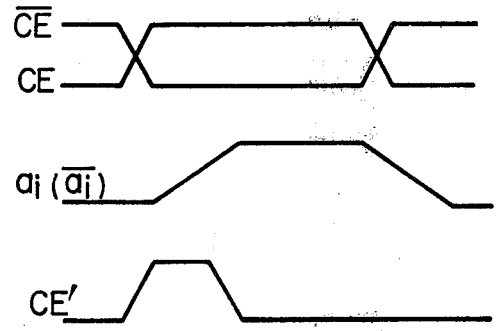
FIG. 3 shows operational waveforms in the circuit of FIG. 2.

As can be seen from the waveforms of FIG. 3, in the circuit of the above structure, since the output signals $ai$ and $\overline{ai}$ have a time lag compared to the chip enable signal CE due to the time lags in the flip-flop and the output circuit, the output signal CE' of this pulse generator circuit takes on a "1" level from the time when the signal CE becomes "1" to the time when the signal $ai$ or $\overline{ai}$ becomes "1".

The dynamic type flip-flop circuit driven by such a signal CE' allows only the minimum current flow to achieve considerable reduction in the power consumption. Here, the chip enable signal CE usually has a pulse width of 100 to 150 nanoseconds. Hence, the dc current consumption according to the above circuit is reduced at most below one half.

For forming a dynamic type flip-flop circuit, the load MISFETs $Q_2$ and $Q_3$ are applied with the constant voltage $V_{DD}$ and triggered by the signal CE' applied to the gates thereof. Thus, no current is allowed to flow between the input terminal A$i$ and the CE' terminal, and a reverse current is hardly allowed to flow from the input terminal A$i$ to the voltage source terminal $V_{DD}$. As a result, the reverse current decreases from a value of 0.7 mA to a value of 1 to 3 $\mu$A, compared with the conventional address buffer circuit in FIG. 5. Further, since the dynamic drive signal CE' of short pulse width is applied to the gates of the load MISFETs $Q_2$ and $Q_3$, the current capacity may be minimized.

The output circuit generates the output signals $ai$ and $\overline{ai}$ through complementary switching MISFETs ($Q_6$, $Q_7$) and ($Q_8$, $Q_9$) and, hence, the output signals $\overline{ai}$ and $ai$ cannot become floating. Since the switching MISFETs $Q_6$ and $Q_7$ ($Q_8$ and $Q_9$) operate in a complementary manner, there arises no problem even when the signal CE is used as the operating voltage source.

Further, during the chip-nanselection period, the signal $\overline{CE}$ which takes on a "chip-nonselection 1" level during the chip-nonselection period is applied to the MISFETs $Q_{10}$ to $Q_{13}$ to turn them on. Thus, the output lines of the flip-flop circuit are grounded to determine the initial value of the flip-flop circuit prior to the activation. Then, this flip-flop circuit will operate in response to the input signal $\overline{Ai}$.

In the above description, the MISFETs used in the embodiment were all of N channel type. It will be apparent that a similar circuit can be formed by the use of P channel MISFETs. In such a case, the polarity of the operating source voltage should be reversed.

The load MISFETs $Q_2$ and $Q_3$ of the flip-flop may be driven by the chip enable signal CE. In such a case, however, care must be paid to a larger dc current consumption as described above.

Figure 4:
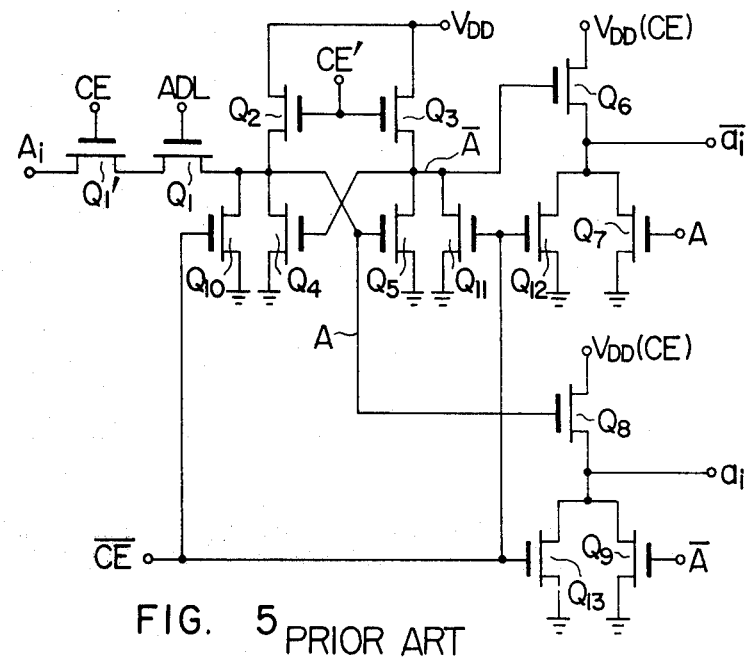
FIG. 4 is a circuit diagram of another embodiment of the address buffer circuit according to this invention.

Further, as in the circuit of FIG. 4, the outputs $\overline{A}$ and A (A and $\overline{A}$) of the flip-flop may be applied to the gates of the FETs $Q_6$ and $Q_7$ ($Q_8$ and $Q_9$) of the driver circuit.

Further, another MISFET $Q_1'$ controlled by the chip enable signal CE may be provided in the input circuit to prevent the input current from flowing through the MISFETs $Q_1$ and $Q_{10}$ in the chip nonselection period.

What is claimed is:

1. An address buffer circuit for a semiconductor memory circuit comprising:
   a dynamic flip-flop circuit operated by an operating voltage and including first and second inverters and voltage-driven load means series-connected to the respective inverters, an input node of each inverter being cross-coupled with an output node of the other inverter, said flip-flop circuit receiving an input signal at the input node of said second inverter and providing mutually opposite output signals at the output nodes of said first and second inverters respectively upon application of a driving pulse signal to said load means to couple said inverters to the operating voltage,
   an output circuit including first and second drivers connected to receive the output signals of the flip-flop circuit respectively from the output nodes of said second and first inverters and providing mutually opposite pulse outputs of the buffer circuit, and
   driving pulse generating means coupled to control terminals of said load means for generating a driving pulse signal existing for a period between the occurrence of a control signal of the memory circuit and that of a pulse output at said output circuit and driving said load means in conduction thereby.

2. The address buffer circuit according to claim 1, wherein each of said first and second inverters with said load means comprises a series connection of metal-insulator-semiconductor field effect transistors (MISFETs), said first and second inverters are connected to a voltage source supplying a constant operating voltage at least in the presence of said driving pulse, and each of said first and second drivers comprises a series connection of MISFETs whose junction is connected to a respective one of a pair of output terminals of said output circuit.

3. The address buffer circuit according to claim 2, wherein the series-connected MISFETs constituting each of said first and second drivers are connected between a terminal for supplying the constant operating voltage at least during the presence of said driving pulse signal and a terminal of a reference potential, and the outputs of said first and second drivers are cross-coupled to the gates of the MISFETs of the drivers which are connected to the reference potential terminal, so as to maintain the output of one of said drivers at the reference potential whenever an output signal is generated at the other driver.

4. The address buffer circuit according to claim 3, wherein another MISFET is connected in parallel to the MISFET of each of said inverters and drivers connected to the reference potential and has a gate applied with another control signal having a phase inverted with respect to said control signal of the memory circuit.

5. The address buffer circuit according to claim 2, wherein the input signal is applied to the flip-flop circuit through a series connection of two MISFETs, one of which has a gate applied with said control signal and the other of which has a gate applied with an address signal, and inputs of said drivers are cross-fed to the gates of those MISFETs of the drivers which are connected to a reference potential.

6. The address buffer circuit according to claim 1, wherein said driving pulse generating means comprises
an input terminal for receiving said control signal,
a ground level terminal,
an output terminal for providing an output signal having a voltage level substantially equal to that of said control signal in synchronism with said control signal, and
means for short-circuiting the output terminal to the ground level upon application of any output signal from the output circuit of said buffer circuit.

7. An address buffer circuit for a semiconductor memory comprising:
an MIS flip-flop circuit operated by an operating voltage and including first and second inverters formed of MISFETs, each of said inverters having an input node applied with an input signal and an output node providing the output of the flip-flop, the input node of each inverter being cross-coupled with the output node of the other inverter;
first and second driver circuits responsive to the outputs of said flip-flop circuit for providing a pair of outputs of the buffer circuit, each driver circuit including a series connection of first and second MISFETs connected to said operating voltage and a reference potential respectively and the node between the series-connected MISFETs serving as one of the pair of the outputs of the buffer circuit;
said first MISFETs of the driver circuits having gates connected to the output nodes of said first and second inverters of the flip-flop circuit respectively, and said second MISFETs of the first and second driver circuits having gates cross-coupled to the output nodes of said first and second driver circuits.

* * * * *